United States Patent
Zortea

(10) Patent No.: US 7,557,626 B1
(45) Date of Patent: Jul. 7, 2009

(54) SYSTEMS AND METHODS OF REDUCING POWER CONSUMPTION OF DIGITAL INTEGRATED CIRCUITS

(75) Inventor: Anthony Eugene Zortea, Pipersville, PA (US)

(73) Assignee: PMC-Sierra, Inc., Santa Clara, CA (US)

(\*) Notice: Subject to any disclaimer, the term of this patent is extended or adjusted under 35 U.S.C. 154(b) by 183 days.

(21) Appl. No.: 11/681,057

(22) Filed: Mar. 1, 2007

Related U.S. Application Data

(60) Provisional application No. 60/778,244, filed on Mar. 2, 2006.

(51) Int. Cl.
G06F 17/50 (2006.01)
(52) U.S. Cl. .......................... 327/158; 716/6
(58) Field of Classification Search ................ 327/155, 327/158, 159, 161–163, 261, 269–272, 276–278, 327/281, 284, 285, 288; 716/2, 6
See application file for complete search history.

(56) References Cited

U.S. PATENT DOCUMENTS 7,205,805 B1 * 4/2007 Bennett ...................... 327/158
7,276,925 B2 * 10/2007 Dobberpuhl et al. ........ 324/763
7,320,118 B2 * 1/2008 Homma et al. ................ 716/6

OTHER PUBLICATIONS

J. Kao et al., "A 175-mV Multiply-Accumulate Unit Using an adaptive Supply Voltage and Body Bias Architecture", IEEE Journal of Solid-State Circuits, vol. 37, No. 11, Nov. 2002, pp. 1545-1554.

\* cited by examiner

Primary Examiner—Lincoln Donovan
Assistant Examiner—Patrick O'Neill
(74) Attorney, Agent, or Firm—Knobbe Martens Olson & Bear LLP

(57) ABSTRACT

There exists a speed/power tradeoff in many digital logic circuits. In one embodiment, the tradeoff is used to reduce or minimize power dissipation by slowing down digital logic paths as system performance requirements allow. Relatively low power dissipation occurs when the histogram of logic path delays is packed towards the critical path delay, and the critical path delay is relatively close to the system clock period. In one embodiment, power is reduced by arranging path delays to be relatively slow. In one embodiment, the histogram of path delays is shaped by establishing classes of paths based on path delay, and individually controlling the classes to slow each class down, preferably relatively close to the delay of the critical path.

35 Claims, 3 Drawing Sheets

SYSTEMS AND METHODS OF REDUCING POWER CONSUMPTION OF DIGITAL INTEGRATED CIRCUITS

CROSS-REFERENCE TO RELATED APPLICATION

This application claims the benefit under 35 U.S.C. § 119(e) of U.S. Provisional Application No. 60/778,244, filed Mar. 2, 2006, the entirety of which is hereby incorporated by reference.

BACKGROUND

1. Field of the Invention

This invention generally relates to digital circuits and in particular to any collection of digital logic, such as in an IC, where power reduction is desired.

2. Description of the Related Art

Power dissipation is becoming a limiting factor in VLSI design as technologies scale down and complexity grows. Leakage, speed increases, and other effects are increasing the amount of power dissipated in integrated circuits (ICs).

Digital logic typically comprises the greatest part of modem ICs and so techniques to reduce the power dissipation of digital circuits typically have relatively large impact on the industry. When considering power dissipation techniques, it is important to note the relationship between the speed and power of a digital path.

As the required speed of a logic path increases, the power dissipated will typically increase. In other words, as the required path delay is decreased, the power dissipated will typically increase. In CMOS processes, this can be the result of several phenomenon: Non-topological techniques to achieve a faster path, i.e., a path with less delay, is usually achieved with larger devices, or lower threshold voltage devices, or devices with forward biased bodies; or some combination of the foregoing. These techniques typically result in greater power dissipated.

There are relatively many logic paths in a typical integrated circuit, and to reach a certain level of overall speed performance for an IC, each logic path should have a delay not exceeding a specified amount. In a synchronous design, the specified maximum path delay is typically the period of a specified system clock signal minus a margin to account for setup times.

Digital logic circuits are usually synthesized from a finite set of logic gates, e.g., from a standard cell library. This finite set of logic gates can include, for example, NAND gates, NOR gates, inverters, flip flops, and the like. Each logic gate usually has a small discrete set of alternatives to achieve various performance objectives such a speed and power. An inverter, for example, may have alternatives with varying drive strengths; which, in the case of the inverter, simply can be implemented with larger or smaller transistors so that the smallest, lowest power inverter can be used in a given application. In another example, the inverter may be available in both high threshold voltage (Vt) and low Vt versions. In the conventional art, there is only a discrete set of such alternatives. The geometry of the transistors or the threshold voltage of the transistors is not variable.

As logic synthesis proceeds, instances of the logic gates are chosen and connected together to achieve some logic function with a delay less than a specified maximum. As used herein, a logic "path" includes the gates and connections from inputs to outputs of a logic function. The delay of the path is the time from the earliest assertion at an input to the last assertion by an output. After logic synthesis is complete, a histogram of all the logic path delays can be generated as shown in FIG. 1. The longest delay is called the "critical path." The delay of the critical path should be less than the specified maximum in order for the overall digital logic section to meet the integrated circuit (IC) performance specification.

FIG. 1 is a histogram generally illustrating a distribution of delay paths with a relatively broad distribution. The limited choices available to an IC designer of digital circuits from a fixed set of logic gates typically results in a path delay histogram with relatively broadly distributed paths, rather than narrowly distributed. The histogram below shows a spread of faster paths and slower paths. When there is an inverse relationship between path delay and potential path power consumption, the presence of paths faster (less time) than the critical path indicates that slower and lower power consuming circuits can be used. Typically, the paths that are faster, that is, shorter delay, than the "max delay allowed" are potentially wasting power.

SUMMARY OF THE INVENTION

One aspect of the invention is to compress a resulting histogram of path delays, in real time as the IC is operating, towards the critical path delay. In one embodiment, this is achieved by establishing one or more classes of paths, based on the path's typical delay, and controlling each path class individually in such a way as to slow it down relatively close, such as near as possible, to the critical path delay. The path class can be determined at logic synthesis. In one embodiment, after the path class has been determined, the classification is stored in a computer-readable memory accessible by a design system.

One aspect of the invention includes the following: establish path classes at logic synthesis time; provide each path class with its own delay/power control signal (body bias, power supply, etc.); generate a control signal by comparing delay of path class to delay of critical path.

One embodiment is an integrated circuit, wherein the integrated circuit includes: a critical path class of gates, said class including gates of at least a critical path of the integrated circuit; a critical path replica circuit configured to model a propagation delay of the critical path; at least one controllable class of gates wherein the at least one controllable class does not include gates of the critical path, wherein the at least one controllable class comprises digital logic circuits having controllable propagation delays relative to propagation delays of the critical path class, wherein the propagation delays are controllable via a control signal; a controllable class replica circuit configured to model a propagation delay of a path of the controllable class of circuits, wherein the propagation delay of the controllable class replica circuit is controllable via the control signal; and a feedback loop for control of the control signal.

One embodiment is an integrated circuit, wherein the integrated circuit includes: two or more classes of digital logic circuits, wherein the two or more classes includes digital logic circuits of at least a critical path class and a controllable class, wherein the critical path class comprises a critical path, wherein paths of the controllable class are expected to be faster in operation than the critical path, wherein the first controllable class includes digital logic circuits having controllable propagation delays relative to a propagation delay of the critical path; and an adaptive control circuit configured to control the controllable propagation delays such that the propagation delays for the controllable class are increased.

One embodiment is an integrated circuit, wherein the integrated circuit includes: a critical path class of digital logic circuits, said class including at least logic circuits of a critical path; and at least one class of digital logic circuits corresponding to logic circuits of paths expected to be faster in operation than the critical path under the same conditions, the at least one class being coupled to a predetermined control to slow down propagation delays through the at least one class relative to propagation delays of the critical path class.

One embodiment is a method of controlling power consumption of a digital integrated circuit, wherein the method includes: comparing a first propagation delay associated with a critical path and a second propagation delay associated with a path from a controllable class of gates, wherein the controllable class of gates does not include gates of the critical path; and controlling the second propagation delay relative to the first propagation delay in response to the comparison.

One embodiment is a method of controlling power consumption of a digital integrated circuit, wherein the method includes: providing the integrated circuit having a critical path class of digital logic circuits, wherein the class includes at least gates of a critical path, the integrated circuit having at least one class of digital logic circuits expected to be faster in operation than the critical path, wherein propagation delays of the at least one class of digital logic circuits are configurable after manufacture relative to the critical path class; and providing a predetermined control to configure the at least one class of digital logic circuits to slow down propagation delays through the at least one class relative to the critical path class.

One embodiment is a method for designing a digital integrated circuit, wherein the method includes: categorizing gates of the integrated circuit into two or more classes of gates based at least partially on expected propagation delays of associated paths of the gates; and separating at least one of a body bias or a power supply source among the two or more classes.

BRIEF DESCRIPTION OF THE DRAWINGS

These drawings and the associated description herein are provided to illustrate specific embodiments of the invention and are not intended to be limiting.

DETAILED DESCRIPTION OF SPECIFIC EMBODIMENTS

Efficient power consumption is a desirable attribute for an electronic circuit. For example, relatively low power consumption is desirable for mobile or wireless products to preserve battery life. Low power consumption is desirable for non-mobile products as well when heat dissipation restrictions and package costs are taken into consideration.

Figure 1:
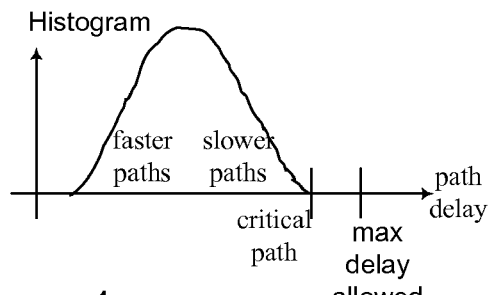
FIG. 1 is a histogram generally illustrating a distribution of delay paths with a relatively broad distribution.
Figure 2:
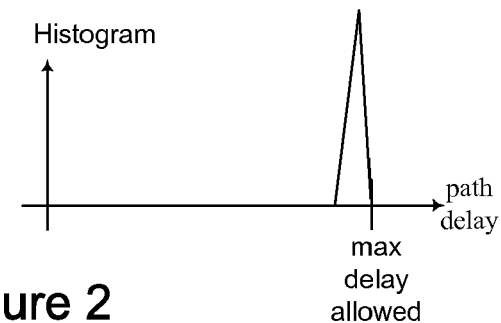
FIG. 2 is a histogram generally illustrating a distribution of delay paths with a relatively narrow distribution.

FIG. 2 is a histogram generally illustrating a distribution of delay paths with a relatively narrow distribution. The path delay histogram illustrated in FIG. 2 is relatively power efficient compared to that illustrated in FIG. 1.

Non-topological solutions to the digital power dissipation problem fall into two categories: increasing the path delays such that the histogram shifts towards the maximum allowed delay, and compressing the range of the path delays such that the histogram is compressed towards the max delay.

In one embodiment, to shift the histogram towards the maximum allowed delay, a replica of the critical path is monitored and a control is derived (the body bias in this case) until the critical path is about equal to the maximum allowed delay. In this way, variations in process parameters that skew a typical design away from the maximum allowed delay can be compensated. By itself, the shifting technique still allows for a broad histogram with many paths that are faster than necessary.

Static squashing of the histogram can be achieved, among other ways, by using multiple threshold voltage (Vt) logic cell libraries. Higher Vt gates are slower but more power efficient, and lower Vt cells are faster at the cost of greater power dissipation. This gives greater resolution on a direct speed/power parameter for the logic cells. In this way, more paths can be made closer to the critical path. However, this technique suffers from its static nature. Variation in process or operating conditions are fixed and not compensated in real time, so there are still more faster paths than is necessary.

Figure 3:
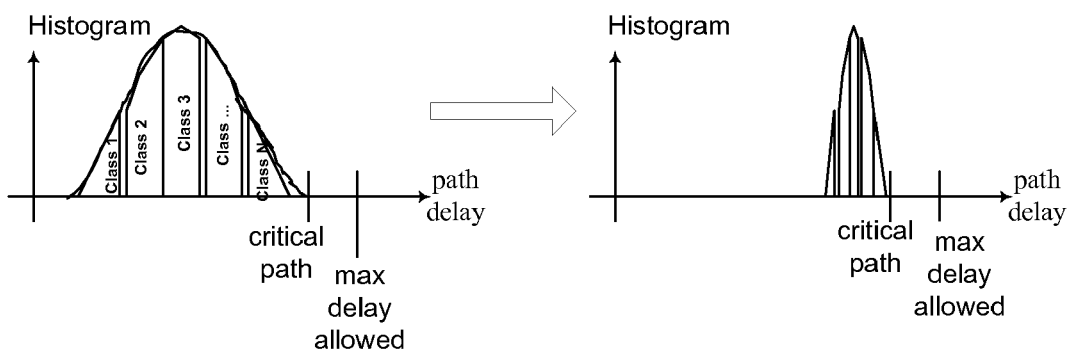
FIG. 3 is a histogram illustrating segmenting paths into two or more classes, and compressing the distribution of delay paths by adjusting delays by class.

FIG. 3 is a histogram illustrating segmenting paths into two or more classes, and compressing the distribution of delay paths by adjusting delays by class. For example, a path class can be controlled by one or more separate signals that possess the delay/power tradeoff (such as body bias, power supply voltage, etc.). In one embodiment, each of the classes is separately controlled. A feedback loop for each applicable class is established to set the control signal in real time to compress or "squash" the resulting histogram. The error signal that is being minimized in the feedback loop can be, for example, the phase difference between a clock delayed by a path replica, and a clock delayed by a critical path replica.

One aspect of the invention includes the following: (1) establishment of path classes at, for example, logic synthesis; (2) provision of an adapted delay/power control signal (body bias, power supply, etc.) to controlled classes; and (3) generation of the control signal by comparison of a delay of a path class to a delay of a critical path. Each of these concepts will be described in further detail in the following.

Establishment of Path Class

In one example, path classes are established at logic synthesis. These path classes are based on delay times. For example, a typical delay time can be used. Other delay times than typical delay times can be used and will be readily determined by one of ordinary skill in the art. For example, a corner of process, voltage, temperature can be selected for the delay. A variety of tools can be used to determine the timing for a path. For example, static timing analysis (STA) techniques can be used. After the delays are characterized, the various components of the integrated circuit can be grouped by the delay times for their respective paths. It should be noted that a particular logic gate can be a member of more than one path.

Figure 4:
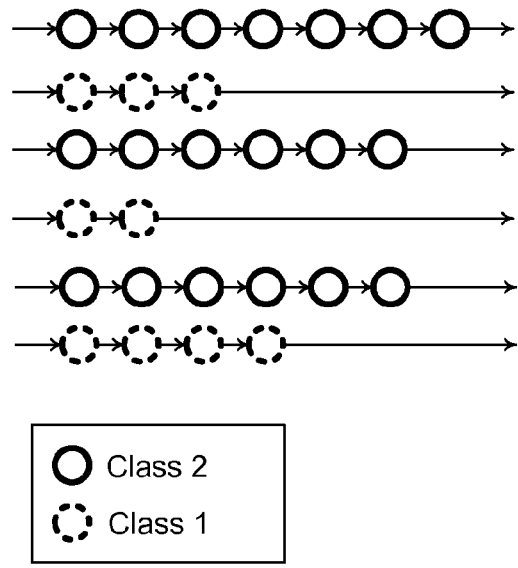
FIG. 4 illustrates a simple example of various path lengths based on numbers of logic gates per path.

FIG. 4 illustrates a relatively simple case of path lengths in which each path is independent of every other path, i.e., paths are not interconnected. A more complicated example will be described in greater detail later in connection with FIG. 6.

The circles in FIG. 4 represent logic gates. Six representative paths are shown, with signals propagating from left to right. In the simple example of FIG. 4, a path length is based on the number of gates from a register output to a register input. Of course, it will be understood that in a practical circuit, the various gates can have different delays, but in this example, the logic delays has been abstracted into the same delays.

In the example of FIG. 4, the logic circuits of the various paths are grouped based on the path delays. The logic gates of relatively shorter delay paths are grouped into Class 1, and the logic gates are represented by dashed circles. The logic gates of relatively longer delay paths are grouped into Class 2, and the logic gates are represented by non-dashed circles. In this example of FIG. 4, paths with more than 4 gates are Class 2, and paths with 4 gates or less are Class 1. In one embodiment, each separate class has its own control signal routed along with the logic paths for control of path delay and management of power consumption.

The delay/power tradeoff for a digital circuit can be adjusted in a variety of ways. For example, a body bias voltage for the individual transistors of a logic gate can be adjusted to adjust the path delays of the paths of the class of logic gates. In another example, a power supply voltage can be adjusted to control the delay/power tradeoff for a class of logic gates.

Generation of Path Control Signal(s)

Figure 5:
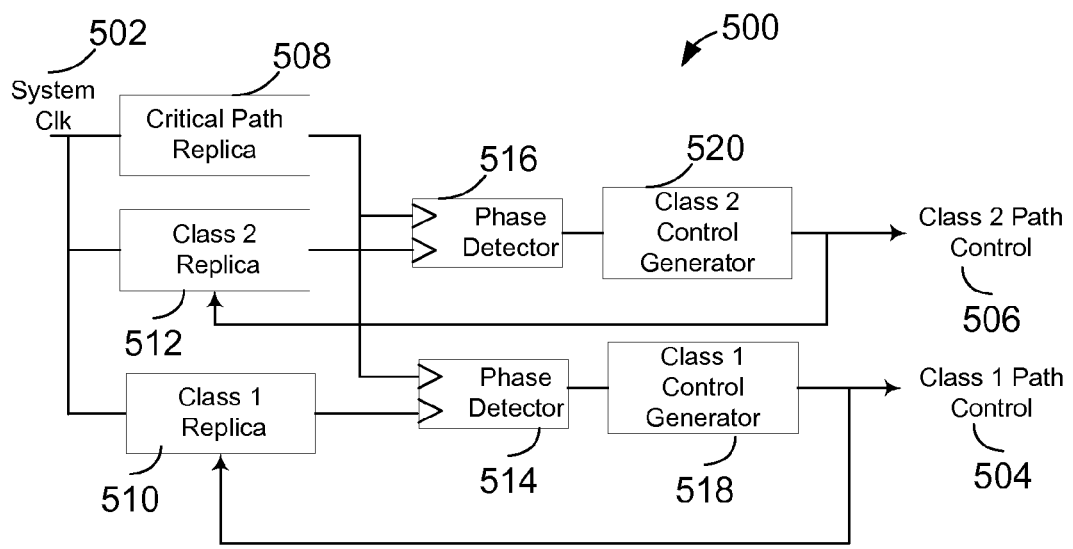
FIG. 5 illustrates an example of generation of a path control signal via an adaptive control circuit.

FIG. 5 illustrates an example of generation of a path control signal via an adaptive control circuit 500, which is implemented as a control loop. The control loop adaptively adjusts the path control signal. A system clock 502 for the integrated circuit is provided as an input. In the illustrated example, two separate path control signals 504, 506 are generated for two classes of logic circuits. It will be understood that the number of classes controlled can vary in a very broad range, such as one or more. In one embodiment, the class of circuits that includes the critical paths is not controlled.

A path control signal can control a desirable power/delay trade-off for a circuit, i.e., the longer the delay, the lower the power. The control of delay via body bias control and/or power supply control are two examples of controls that are capable of exploiting this trade-off.

In the illustrated embodiment, the path control signals are generated by comparing the phases of class replicas to the critical path replica, as shown in the FIG. 5.

The illustrated circuit includes a critical path replica circuit 508, a class 1 replica circuit 510, a class 2 replica circuit 512, a class 1 phase detector 514, a class 2 phase detector 516, a class 1 control generator circuit 518, and a class 2 control generator circuit 520. The critical path replica circuit 508 operates as a timing reference for the other replica path circuits. In the illustrated embodiment, neither the critical path class of circuits nor the critical path replica circuit 508 are adjustable for delay/power.

In one embodiment, the critical path replica circuit 508 replicates the timing delay of the critical path for the particular integrated circuit. The particular path that is the critical path is identifiable during chip design using, for example, static timing analysis. The class 1 replica circuit 510 and the class 2 replica circuit 512 replicate the timing delays of paths of their respective controllable classes. For example, the class 1 replica circuit 510 can replicate the path timing of the slowest path within the class 1 circuits. However, references to the timing delays of the critical path or of the controlled paths are desired so that the actual timing between a path and replica paths can vary so long as proportionality is at least approximately maintained.

A first feedback loop for control of class 1 circuits is formed from the class 1 replica circuit 510, the class 1 phase detector 514, and the class 1 control generator 518. The system clock is propagated through each of the critical path replica circuit 508 and the class 1 replica circuit 510. The propagation delays are compared by the class 1 phase detector 514. The class 1 phase detector 514 can provide a signal approximately proportional to the phase difference between the signals from the replica circuits. The class 1 control generator circuit 518 provides an appropriate output for the control of the path delay/power tradeoff. For example, the path control signal 504 can control the body bias(es) of the NMOS and/or PMOS transistors of the class 1 circuits, can control the power supply voltages for the particular class, or both. The path control signal 504 is also provided as an input to the class 1 replica circuit 510 to adjust the propagation delay thereof, which then permits the path control signal 504 to be adaptively adjusted in real time. Since the class 1 replica circuit 510 is fabricated on the same integrated circuit as the class 1 circuits, the same process, voltage, and temperature (PVT) variations are experienced by the circuits.

A second feedback loop for control of class 2 circuits is formed from the class 2 replica circuit 512, the class 2 phase detector 516, and the class 2 control generator 520. General operation for the illustrated second feedback loop is the same as described for the first feedback loop. The second feedback loop generates a class 2 path control 506 to permit the path delay control of an additional class of circuits.

In one embodiment, when higher speed is desired, the power supply voltage is raised and when lower speed is desired, the power supply voltage is lowered. In one embodiment, when higher speed is desired, the body bias is adjusted to lower the threshold voltage, and when lower speed is desired, the body bias is adjusted to raise the threshold voltage. The control signals 504, 506 from the outputs of the control generators 518, 520 are provided to both the actual paths being controlled and for the replica circuits being monitored. In addition, as will be appreciated by the skilled practitioner, other components such as low-pass filtering on the output of the phase detector 514, 516 can also be used.

Further with respect to adjustment of body biases, in CMOS circuits, both PMOS and NMOS devices exist. It will be understood that when body bias control is used with CMOS, that separate body biases can be used for the PMOS and the NMOS devices of a class. These biases can be adjusted together or separately.

Interconnected Paths

Figure 6:
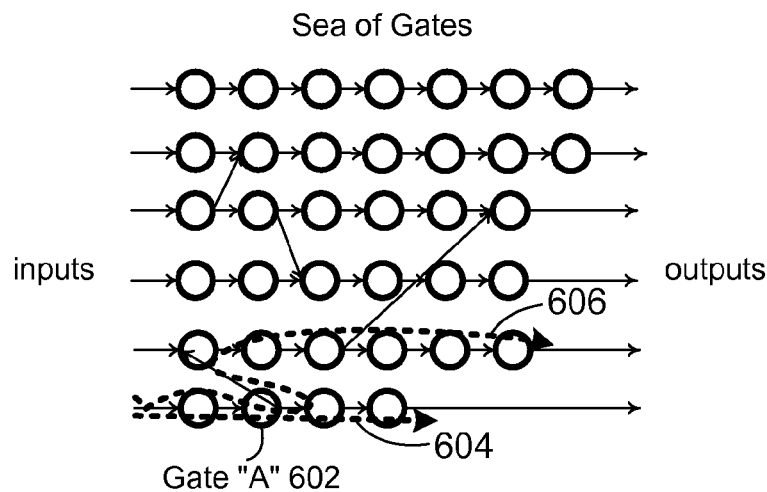
FIG. 6 illustrates an example of path timing with gates belonging to more than one path.

FIG. 6 illustrates an example of path timing with gates belonging to more than one path. Many paths of an integrated circuit are interconnected, i.e., one path depends on a part of another path, so that a particular gate can belong to more than one path. When there are multiple classes of gates on a particular integrated circuit and there are interconnected paths, a gate may belong to two or more paths having different path delays. For these gates, it can be useful to determine which class membership is appropriate.

A sea of gates is illustrated in FIG. 6. Various paths are drawn from left to right. Individual gates are represented by circles. Gate I/Os are represented by arrows. Gate "A" 602 is part of at least two paths 604, 606 from input to output. A relatively short path 604 has 4 total modeled gates. The relatively longer path 606 has 8 modeled gates.

In one embodiment, class membership for a gate is determined based on the longest delay path that the gate belongs to, when the gate belongs to more than one path. Using this rule, in the illustrated example, gate "A" 602 is assigned to the class for the longer path 608 having length 8. This provides for conservative adjustment of propagation delay.

The concept of path "length" can also be extended to consider that gate delays are unequal. So the class membership can be determined by the total delay of a given path, under certain conditions, such as the "typical" process-voltage-temperature (PVT) corner, or perhaps the worst case PVT corner, or other conditions. For example, the total delay can be determined by static timing analysis.

Static or Predetermined Class Control

In one embodiment, rather than use a phase detector-based circuit as illustrated in FIG. 5, one or more circuit classes are identified that have shorter path delays than the critical path. These one or more circuit classes can be separately slowed in speed in comparison to the devices of the critical path to efficiently use power.

For example, a path control signal, such as body bias control, power supply voltage control, etc., can be relatively fixed and can vary among various classes. For example, the threshold voltage $V_T$ can be raised by adjustment of the body bias when a decrease in speed can be tolerated. This can advantageously reduce the power consumption of the circuit. In one embodiment, the body bias and/or the power supply voltage (such as VDD) is fixed, but at a different setting than the body bias and/or the power supply voltage used for the critical paths. These techniques can provide a way for an end-user to customize a particular threshold voltage for selected transistors of an integrated circuit. In one embodiment, the speed of the controllable classes is determined during test, during static timing analysis, or the like.

Figure 7:
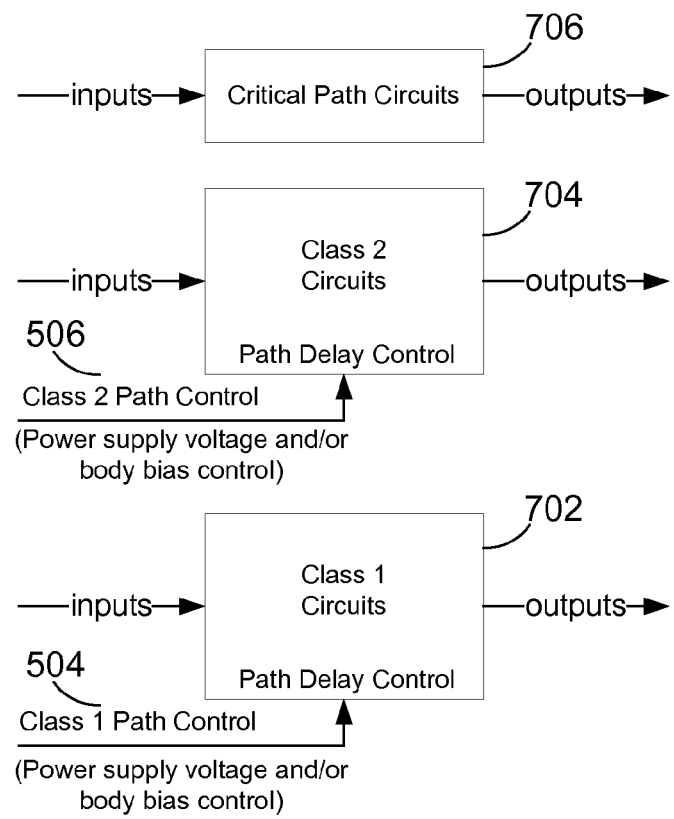
FIG. 7 illustrates a critical path class of gates, a critical path replica circuit, a controllable class of gates, a controllable class replica circuit, and a feedback loop for control of the control signal.

FIG. 7 illustrates an integrated circuit, wherein the integrated circuit includes: a critical path class of gates 706, said class including gates of at least a critical path of the integrated circuit; a critical path replica circuit 508 (FIG. 5) configured to model a propagation delay of the critical path 706; at least one controllable class of gates 702 wherein the at least one controllable class 702 does not include gates of the critical path, wherein the at least one controllable class 702 comprises digital logic circuits having controllable propagation delays relative to propagation delays of the critical path class 706, wherein the propagation delays are controllable via a control signal 504; a controllable class replica circuit 510 (FIG. 5) configured to model a propagation delay of a path of the controllable class of circuits 702, wherein the propagation delay of the controllable class replica circuit 510 is controllable via the control signal 504; and a feedback loop 510, 514, 518 (FIG. 5) for control of the control signal 504.

The class 1 replica circuit 510 (FIG. 5) and the class 2 replica circuit 512 (FIG. 5) replicate the timing delays of paths of their respective controllable classes 702, 704. For example, the class 1 replica circuit 510 can replicate the path timing of the slowest path within the class 1 circuits 702.

The class 1 control generator circuit 518 provides an appropriate output for the control of the path delay/power tradeoff. For example, the path control signal 504 can control the body bias(es) of the NMOS and/or PMOS transistors of the class 1 circuits 702, can control the power supply voltages for the particular class, or both.

Various embodiments have been described above. A technique to reduce power dissipation by dynamically adjusting path delays has been described. A technique to reduce power dissipation by static adjustment has also been described. Although described with reference to these specific embodiments, the descriptions are intended to be illustrative and are not intended to be limiting. Various modifications and applications may occur to those skilled in the art without departing from the true spirit and scope of the invention as defined by the appended claims.

What is claimed is:

1. An integrated circuit comprising:
   a critical path class of gates, said class including gates of at least a critical path of the integrated circuit;
   a critical path replica circuit configured to model a propagation delay of the critical path;
   at least one controllable class of gates wherein the at least one controllable class does not include gates of the critical path, wherein the at least one controllable class comprises digital logic circuits having controllable propagation delays relative to propagation delays of the critical path class, wherein the propagation delays are controllable via a control signal;
   a controllable class replica circuit configured to model a propagation delay of a path of the controllable class of gates, wherein the propagation delay of the controllable class replica circuit is controllable via the control signal; and
   a feedback loop for control of the control signal.

2. The integrated circuit of claim 1, wherein the critical path replica circuit and the controllable class replica circuit are coupled to receive a clock signal, wherein the feedback loop further comprises:
   a phase detector coupled to outputs of the critical path replica circuit and the controllable class replica circuit, the phase detector configured to compare a phase difference between the propagation delays by the critical path replica circuit and the controllable class replica circuit; and
   a control generator circuit configured to receive a phase difference output of the phase detector and to generate the control signal.

3. The integrated circuit of claim 1, wherein the control signal comprises a control for a body bias.

4. The integrated circuit of claim 1, wherein the control signal comprises a control for a power supply voltage.

5. The integrated circuit of claim 1, wherein the control signal comprises a control for both a body bias and a power supply voltage.

6. The integrated circuit of claim 1, further comprising:
   a second controllable class of gates wherein the second controllable class does not include gates of the critical path, wherein the second controllable class comprises digital logic circuits having second controllable propagation delays relative to the propagation delay of the critical path and relative to the propagation delays of the controllable class of gates, wherein the second controllable propagation delays are controllable via a second control signal; and
   a second controllable class replica circuit configured to model a propagation delay of a path of the second controllable class of gates, wherein the propagation delay of the second controllable class replica circuit is controllable via the second control signal.

7. The integrated circuit of claim 1, further comprising a plurality of independently controllable classes, wherein membership in a class for a gate is determined at least partially based on a propagation delay of a path associated with the gate.

8. The integrated circuit of claim 1, further comprising a plurality of independently controllable classes, wherein membership in a class for a gate is determined at least partially based on a length of a path associated with the gate.

9. The integrated circuit of claim 1, further comprising a plurality of independently controllable classes, further comprising a gate that is interconnected such that the gate is associated with two or more paths, wherein membership in a class for the gate is determined by a path that is expected to be slowest in operation among the two or more associated paths.

10. The integrated circuit of claim 1, wherein the propagation delays of the critical path class are not controllable.

11. The integrated circuit of claim 1, wherein the controllable class replica circuit is configured to model a propagation delay of a slowest path of the controllable class of gates.

12. An integrated circuit comprising:
two or more classes of digital logic circuits, wherein the two or more classes comprise at least a critical path class and a controllable class, wherein the critical path class includes digital logic circuits of a critical path, wherein paths of the controllable class are expected to be faster in operation under the same conditions than the critical path, wherein the controllable class includes digital logic circuits having controllable propagation delays relative to a propagation delay of the critical path; and
an adaptive control circuit configured to control the controllable propagation delays such that the propagation delays for the controllable class are increased.

13. The integrated circuit of claim 12, wherein the adaptive control circuit is configured to control the controllable propagation delays such that a propagation delay for at least one path of the controllable class is about the same as the propagation delay of the critical path.

14. The integrated circuit of claim 12, wherein the adaptive control circuit is configured to control the controllable propagation delays via adjustment of a power supply voltage for the digital logic circuits of the controllable class.

15. The integrated circuit of claim 12, wherein the adaptive control circuit is configured to control the controllable propagation delays via adjustment of a body bias for the digital logic circuits of the controllable class.

16. The integrated circuit of claim 12, further comprising a plurality of controllable classes of varying path lengths each having independently controllable propagation delays, wherein a gate corresponding to two or more controllable classes is allocated to a longest path length class of the two or more controllable classes for control of propagation delay.

17. An integrated circuit comprising:
a critical path class of digital logic circuits, said class including at least logic circuits of a critical path; and
at least one class of digital logic circuits corresponding to logic circuits of paths expected to be faster in operation than the critical path under the same conditions, the at least one class being coupled to a static control configured to slow down propagation delays through the at least one class relative to propagation delays of the critical path class.

18. The integrated circuit of claim 17, wherein a propagation delay from the at least one class is about the same as the propagation delay of the critical path.

19. The integrated circuit of claim 17, wherein the static control comprises a predetermined power supply voltage.

20. The integrated circuit of claim 17, wherein the static control comprises a predetermined body bias.

21. The integrated circuit of claim 17, wherein an expected operational speed for a path is determined by a path length.

22. A method of controlling power consumption of a digital integrated circuit, the method comprising:
comparing a first propagation delay associated with a critical path and a second propagation delay associated with a path from a controllable class of gates, wherein the controllable class of gates does not include gates of the critical path; and
controlling the second propagation delay relative to the first propagation delay in response to the comparison.

23. The method of claim 22, wherein comparing further comprises:
receiving a clock signal;
propagating the clock signal through a first replica circuit for the critical path to generate the first propagation delay;
propagating the clock signal through a second replica circuit for the controllable class of gates to generate the second propagation delay; and
determining a phase difference between outputs of the first replica circuit and the second replica circuit to compare the first propagation delay and the second propagation delay.

24. The method of claim 23, wherein controlling further comprises adaptively adjusting the second propagation delay relative to the first propagation delay in response to the determined phase difference such that the second propagation delay is about the same as the first propagation delay.

25. The method of claim 22, second propagation delay is associated with a slowest path from the controllable class of gates.

26. The method of claim 22, wherein controlling comprises adjusting a body bias for the controllable class of gates.

27. The method of claim 22, wherein controlling comprises adjusting a power supply voltage for the controllable class of gates.

28. The method of claim 22, wherein controlling comprises adjusting a body bias and a power supply voltage for the controllable class of gates.

29. A method of controlling power consumption of a digital integrated circuit, the method comprising:
providing the integrated circuit having a critical path class of digital logic circuits, wherein the class includes at least gates of a critical path, the integrated circuit having at least one class of digital logic circuits expected to be faster in operation under the same conditions than the critical path, wherein propagation delays of the at least one class of digital logic circuits are configurable after manufacture relative to the critical path class; and
providing a predetermined control to configure the at least one class of digital logic circuits to slow down propagation delays through the at least one class relative to the critical path class.

30. The method of claim 29, further comprising determining the predetermined control during production test.

31. The method of claim 29, wherein the predetermined control comprises predetermining a body bias for the at least one class of circuits.

32. The method of claim 29, wherein the predetermined control comprises predetermining a power supply voltage for the at least one class of circuits.

33. The method of claim 29, wherein the predetermined control adjusting a body bias and a power supply voltage for the at least one class of circuits.

34. The method of claim 29, wherein the at least one class of digital logic circuits comprises a plurality of classes, further comprising a gate that is interconnected such that the gate is associated with two or more paths, wherein membership in a class of the plurality of classes for the gate is determined by a path that is expected to be slowest in operation among the two or more associated paths.

35. A method for designing a digital integrated circuit, the method comprising:

categorizing gates of the integrated circuit into two or more classes of gates based at least partially on expected propagation delays of associated paths of the gates; and controlling at least one of a body bias or a power supply source among the two or more classes, wherein the two or more classes would have different propagation delays under the same conditions.

* * * * *